United States Patent
Wallichs

(10) Patent No.: US 10,128,851 B1
(45) Date of Patent: Nov. 13, 2018

(54) TECHNIQUES FOR PROGRAMMING CIRCUITS USING MODE DECODING

(71) Applicant: Intel Corporation, Santa Clara, CA (US)

(72) Inventor: Gary Wallichs, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/823,260

(22) Filed: Nov. 27, 2017

(51) Int. Cl.
| | |
|---|---|
| *H03K 19/177* | (2006.01) |
| *H03K 19/0175* | (2006.01) |
| *G06F 15/78* | (2006.01) |
| *G11C 16/10* | (2006.01) |
| *G06F 15/177* | (2006.01) |
| *G11C 8/10* | (2006.01) |

(52) U.S. Cl.
CPC ..... *H03K 19/17744* (2013.01); *G06F 15/177* (2013.01); *G06F 15/7867* (2013.01); *G11C 8/10* (2013.01); *G11C 16/10* (2013.01); *H03K 19/017581* (2013.01); *H03K 19/1776* (2013.01)

(58) Field of Classification Search
None
See application file for complete search history.

(56) References Cited

U.S. PATENT DOCUMENTS

| | | | | |
|---|---|---|---|---|
| 6,150,838 A | * | 11/2000 | Wittig | H03K 19/1737 326/38 |
| 6,288,970 B1 | * | 9/2001 | Reddy | G11C 7/10 326/39 |
| 6,732,263 B1 | * | 5/2004 | May | G06F 13/405 326/41 |
| 7,268,582 B1 | | 9/2007 | Zheng et al. | |
| 8,051,227 B1 | * | 11/2011 | Gewirtz | G06F 9/544 710/56 |
| 9,425,802 B1 | | 8/2016 | Xiao | |
| 2011/0199117 A1 | * | 8/2011 | Hutchings | G06M 3/00 326/38 |

* cited by examiner

*Primary Examiner* — Minh D A
*Assistant Examiner* — James H Cho
(74) *Attorney, Agent, or Firm* — Steven J. Cahill

(57) ABSTRACT

An integrated circuit includes programmable circuits, a configuration status register circuit, a mode register circuit, a mode decoder circuit, and a multiplexer circuit. The configuration status register circuit stores configuration bits and is coupled to provide the configuration bits to the programmable circuits to program the programmable circuits to implement functions of a first mode. The mode register circuit is coupled to store mode bits. The mode decoder circuit decodes at least a subset of the mode bits received from the mode register circuit to generate decoded bits. The multiplexer circuit is coupled to provide the decoded bits from the mode decoder circuit to the programmable circuits to reprogram the programmable circuits to implement functions of a second mode.

21 Claims, 6 Drawing Sheets

TECHNIQUES FOR PROGRAMMING CIRCUITS USING MODE DECODING

FIELD OF THE DISCLOSURE

The present disclosure relates to electronic circuits, and more particularly, to techniques for programming circuits using mode decoding.

BACKGROUND

Programmable integrated circuits can be configured to perform a variety of logical user functions. Programmable integrated circuits (ICs) include field programmable gate arrays (FPGAs), programmable logic devices (PLDs), programmable logic arrays, configurable logic arrays, etc. Programmable ICs typically have numerous programmable logic blocks that can be configured to implement various combinatorial and sequential functions. The logic blocks have access to a programmable interconnect structure. The programmable interconnect structure can be programmed to interconnect the logic blocks in almost any desired configuration.

Many programmable ICs have on-chip hard intellectual property (HIP) circuit blocks. HIP circuit blocks have some circuit features that are programmable by users. However, HIP circuit blocks often have less programmability than the standard programmable logic blocks in the core region of a programmable IC.

DETAILED DESCRIPTION

Figure 1:
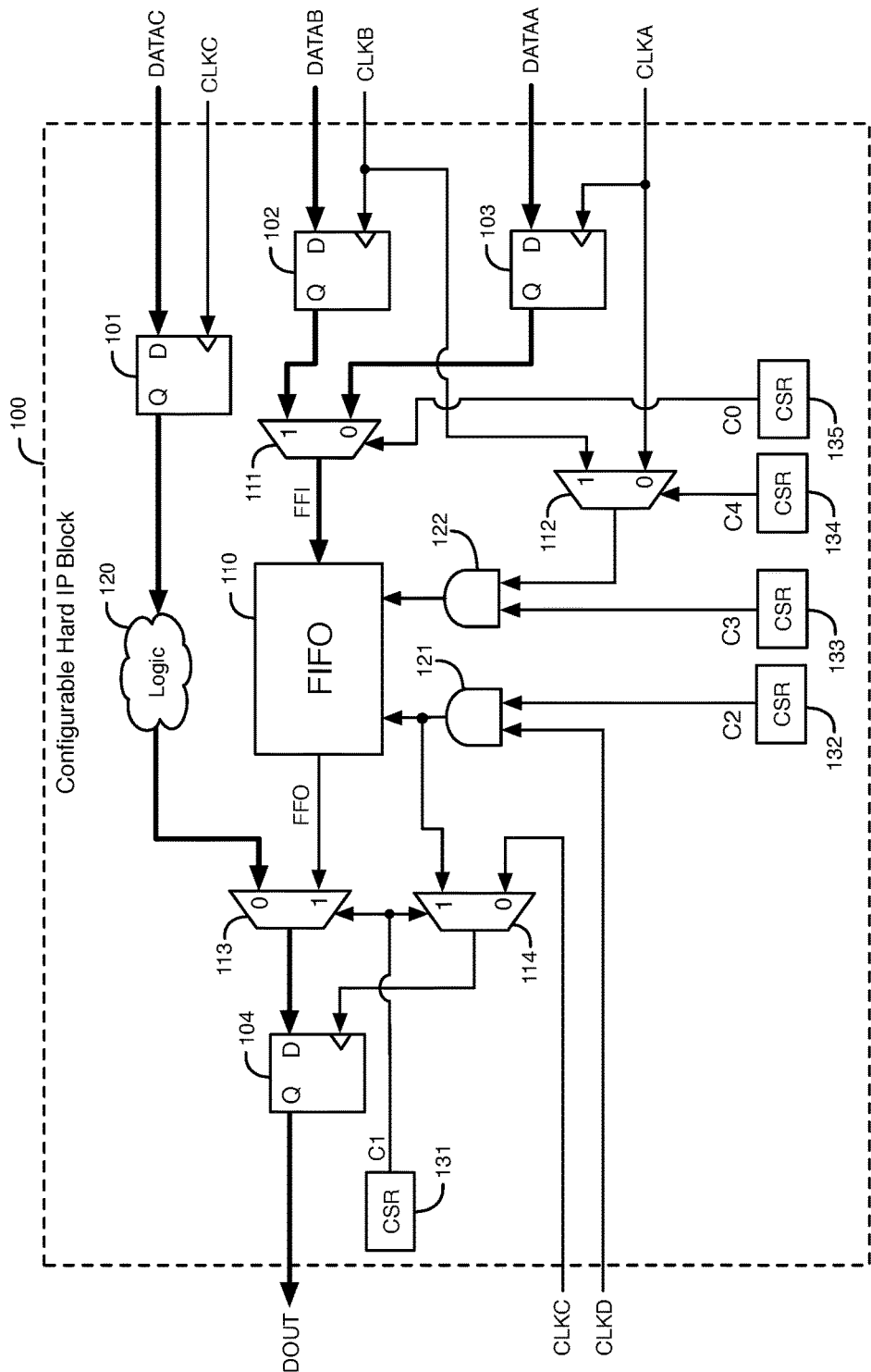
FIG. 1 illustrates an example of a configurable hard intellectual property (HIP) circuit block, according to an embodiment.

As programmable integrated circuits (ICs), such as FPGAs, continue to fuel developing markets, the demand for multiple hard intellectual property (HIP) circuit blocks, such as PCI Express controllers, Ethernet stacks, and forward error correction circuits, in each programmable IC continues to grow. FPGA hardware design integrators and software tools configure multiple HIP circuit blocks, each of which can support multiple modes, and interface with each other.

In traditional field programmable gate array (FPGA) designs, FPGA software tools are used to take in user design feedback through an interface, such as a graphical user interface (GUI), and map the user intention to the proper legal hardware configuration, described using a hardware-to-software abstraction layer, referred to as a design intent. After bits for the design intent are computed by the FPGA software tools, the bits are placed into a serial FPGA bit stream file at predetermined bit positions.

FPGA hardware designers typically deliver information about the configurability of the HIP blocks that can be used by software to infer the HIP blocks design intent. This design intent collateral can be used by software tools to expose the configurability of the HIP blocks to users, and facilitate building software data structures that represent the configuration of the HIP blocks. The creation of the collateral can be both challenging, time consuming, and require long iteration cycles to improve the quality based on software feedback. Additionally, the design intent itself must be verified in conjunction with the hardware description language (HDL) models. This requirement places an additional burden on the design verification engineer, to verify not just the HDL circuit, but the design intent itself.

The process to create and verify the quality of the configuration design intent in FPGA hardware is time consuming. Ensuring that the design intent can be consumed, processed, and tested by an FPGA software tool provides a long feedback loop to correct the content. Additionally, software translation is typically performed by a software engineer, who may not be familiar with the functionality of the HIP blocks, and may generate translation errors.

Furthermore, when early FPGA silicon chips are being tested in the lab, the silicon validation engineer must deal with sorting through whether issues may be related to the actual silicon or software induced translation errors. This slows down the silicon bring-up cycle, and may lead validation engineers down wrong paths, as they work towards issue root cause.

According to some embodiments disclosed herein, the programmable circuit features of configurable circuit blocks, such as hard intellectual property (HIP) blocks, in an integrated circuit (IC) are configured using one or more mode registers. After mode bits indicating a mode of a configurable circuit block are stored in a mode register, a decoder decodes the mode bits stored in the mode register to generate a common coordinated set of mode specific bits that control the programmable circuit features of the circuit block. The set of modes for the circuit blocks can be more easily verified with the HDL models, and therefore, minimize the effort it takes to verify the full design intent.

Additionally, when multiple circuit blocks are used to form configurable systems, programming the same mode value into each circuit block may be interpreted as enabling the same mode. This technique minimizes the amount of design intent that is required for software to process and program circuit blocks. Instead of programming multiple register fields in multiple different circuit blocks, software only needs to write one common mode value into each mode register in order to program the circuit blocks.

FIG. 1 illustrates an example of a configurable hard intellectual property (HIP) circuit block 100, according to an embodiment. HIP circuit block 100 may be in a programmable integrated circuit (IC), such as an FPGA, or in any other type of IC, such as a microprocessor or graphics processing unit (GPU). HIP circuit block 100 includes programmable circuits, such as register circuits 101-104, multiplexer circuits 111-114, first-in-first-out (FIFO) circuit 110, logic AND gate circuits 121-122, and logic circuit 120.

The HIP circuit block 100 implements several different modes that are controllable by programmable configuration status registers (CSRs) 131-135. The programmable circuits of HIP block 100 perform different functions in each of the modes. The modes discussed herein may also be referred to as modes of operation. The CSRs 131-135 generate configuration signals C1, C2, C3, C4, and C0, respectively, as shown in FIG. 1. These configuration signals C0-C4 are used to control various selection circuits and enables in block 100.

As an example, a user may set signal C1 to logic 0 in order to bypass the internal FIFO circuit 110 to drive data from DATAC to DOUT in a first mode. Logic circuit 120 generates a data output based on data from data signals DATAC that is provided via register 101. Setting C1 to logic 0 causes multiplexer circuit 113 to provide the data output of logic circuit 120 to the D input of register 104, and multiplexer circuit 114 to provide clock signal CLKC to the clock input of register 104. Register 104 provides the data at its D input to its output as signals DOUT in response to clock signal CLKC.

As another example, a user may configure block 100 to provide data through FIFO 110 from data input signals DATAA to the data output DOUT in a second mode. Enabling this mode involves setting signal C4 to logic 0, setting signal C3 to logic 1, setting signal C2 to a logic 1, setting signal C0 to logic 0, and setting signal C1 to logic 1. Setting signal C4 to logic 0 and setting signal C3 to logic 1 causes multiplexer circuit 112 and logic AND gate 122 to provide clock signal CLKA to a first clock input of FIFO 110. Setting signal C2 to a logic 1 causes logic AND gate 121 to provide clock signal CLKD to a second clock input of FIFO 110. Setting signal C0 to a logic 0 causes multiplexer circuit 111 to provide the data indicated by signals DATAA from the output of register 103 to the data input of FIFO 110 as signals FFI. FIFO 110 stores the data at its data input and subsequently outputs the data at its data output as signals FFO. Setting signals C1 and C2 to logic 1 causes multiplexer circuit 114 to provide clock signal CLKD to the clock input of register 104. Setting signal C1 to logic 1 also causes multiplexer circuit 113 to provide the data at the output of FIFO 110 to the D input of register 104 to be output as signals DOUT in the next cycle of clock signal CLKD.

As yet another example, signal C0 may be set to logic 1 to cause data from input data signals DATAB to be provided to the data input of FIFO 110 in a third mode of block 100. In this mode, the data from signals DATAB is stored in FIFO 110 and then subsequently output through multiplexer circuit 113 and register 104, as described above. Registers 101, 102, and 103 are clocked by clock signals CLKC, CLKB, and CLKA, respectively.

Figure 2:
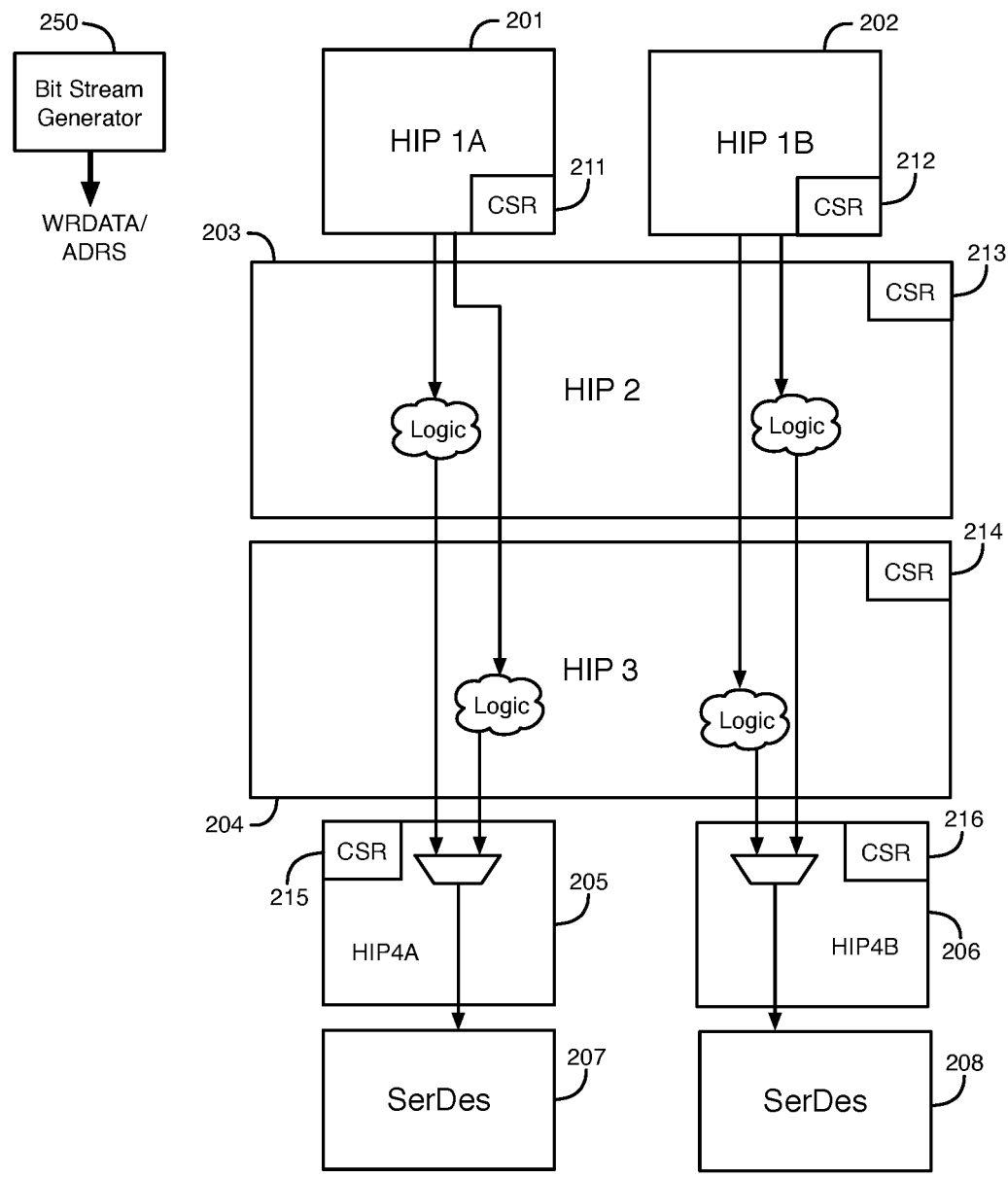
FIG. 2 illustrates a transceiver circuit having hard intellectual property (HIP) circuit blocks in an integrated circuit, according to an embodiment.

FIG. 2 illustrates a transceiver circuit having hard intellectual property (HIP) circuit blocks in an integrated circuit, according to an embodiment. The transceiver circuit of FIG. 2 includes 6 HIP circuit blocks 201-206 and two serializer-deserializer (SerDes) circuit blocks 207-208. Data may be transmitted through the transceiver circuit, for example, from HIP blocks 201-202 through logic in HIP blocks 203 and 204 and through HIP blocks 205-206 to SerDes blocks 207-208, as shown in FIG. 2. The integrated circuit (IC) may be, for example, a programmable IC or any other type of IC, such as a microprocessor or graphics processing unit.

In the system of FIG. 2, each hard IP circuit block has a configuration status register (CSR) block. HIP circuit blocks 201-206 include CSR blocks 211-216, respectively, as shown in FIG. 2. A bit stream generator device 250 generates configuration bits and mode bits WRDATA and address bits ADRS for each of the HIP circuit blocks 201-206. The bit stream generator device 250 may be, for example, a software tool running on a computer that is external to the IC that contains the other circuitry shown in FIG. 2.

Each of the CSR blocks 211-216 includes an N-bit mode register that stores N mode bits. When the mode bits are stored in the mode register in a CSR block, a mode decoder in the CSR block decodes the mode bits to generate a set of decoded configuration bits to be stored in one or more of the configuration status registers. In this example, the decoded bits are used to provide the circuit selection controls and enables for various modes instead of the full-programmable configuration register values. These collective sets of modes can be more easily verified with the HDL models, and as a result, they can reduce efforts to verify a full design intent.

Also, when multiple HIP circuit blocks are used to form a configurable system, as shown for example in FIG. 2, each HIP circuit block may contain a similar mode register and override, and thus programming the same mode bit value into each HIP circuit block causes each HIP circuit block to implement the same mode. This technique minimizes the amount of design intent that is required for software to process and program. Instead of programming multiple register fields in different HIP blocks, software may, for example, only write one common mode value into the mode register in the CSR block in each HIP circuit block to make the system operate as intended.

Figure 3:
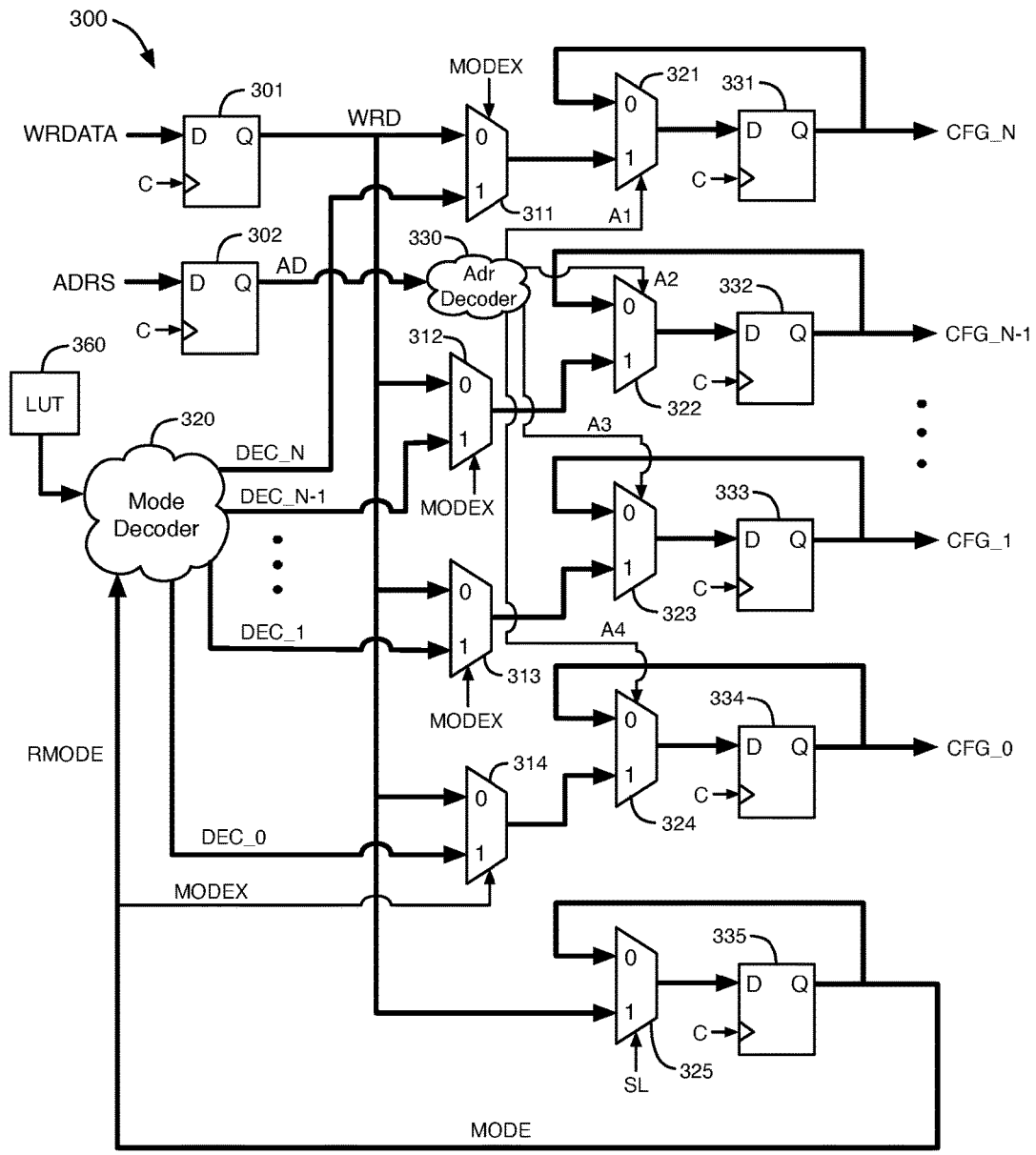
FIG. 3 illustrates an example of a configuration status register (CSR) block in a hard intellectual property (HIP) block having a mode register, according to an embodiment.
Figure 4:
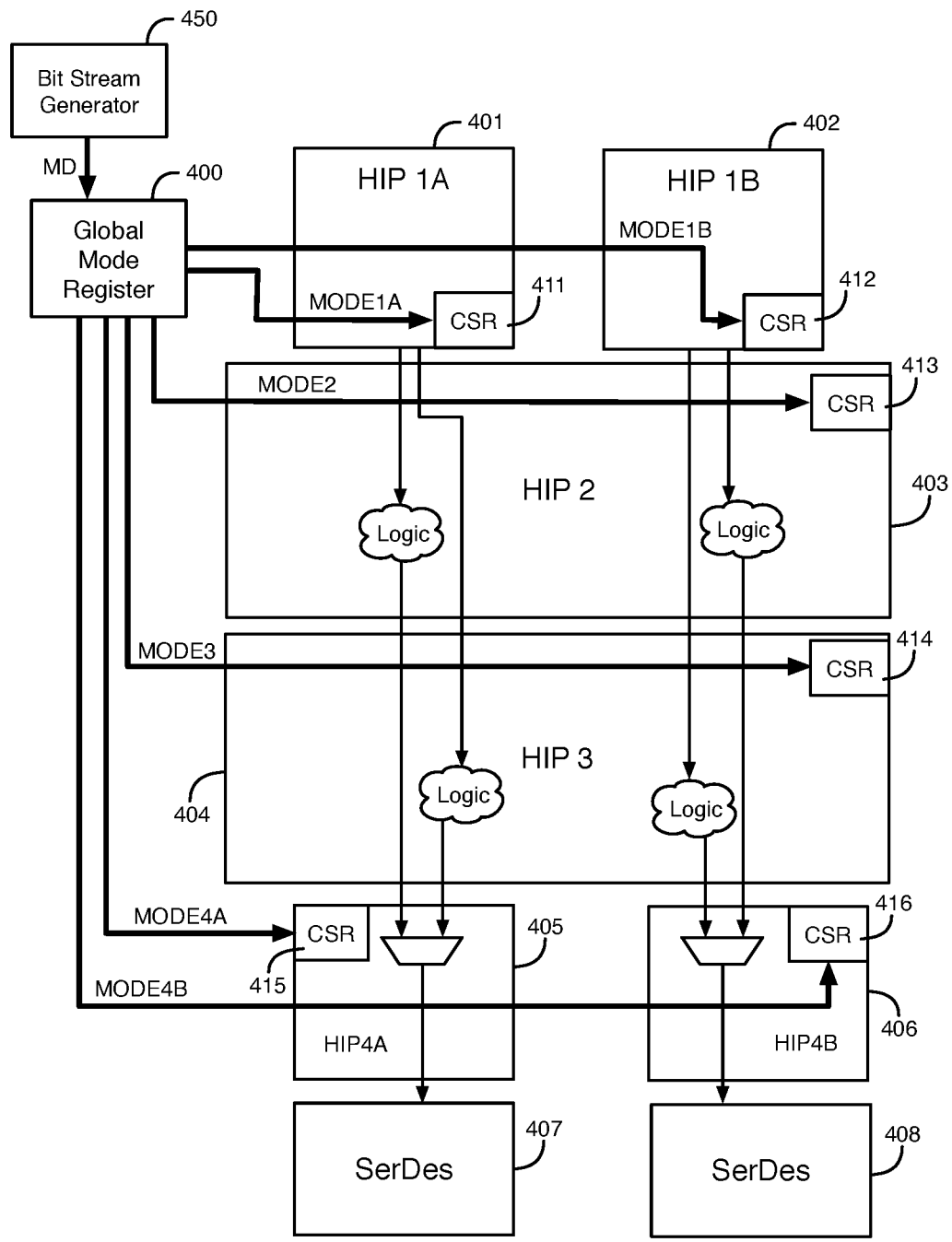
FIG. 4 illustrates a transceiver circuit having hard intellectual property (HIP) circuit blocks in an integrated circuit, according to another embodiment.
Figure 5:
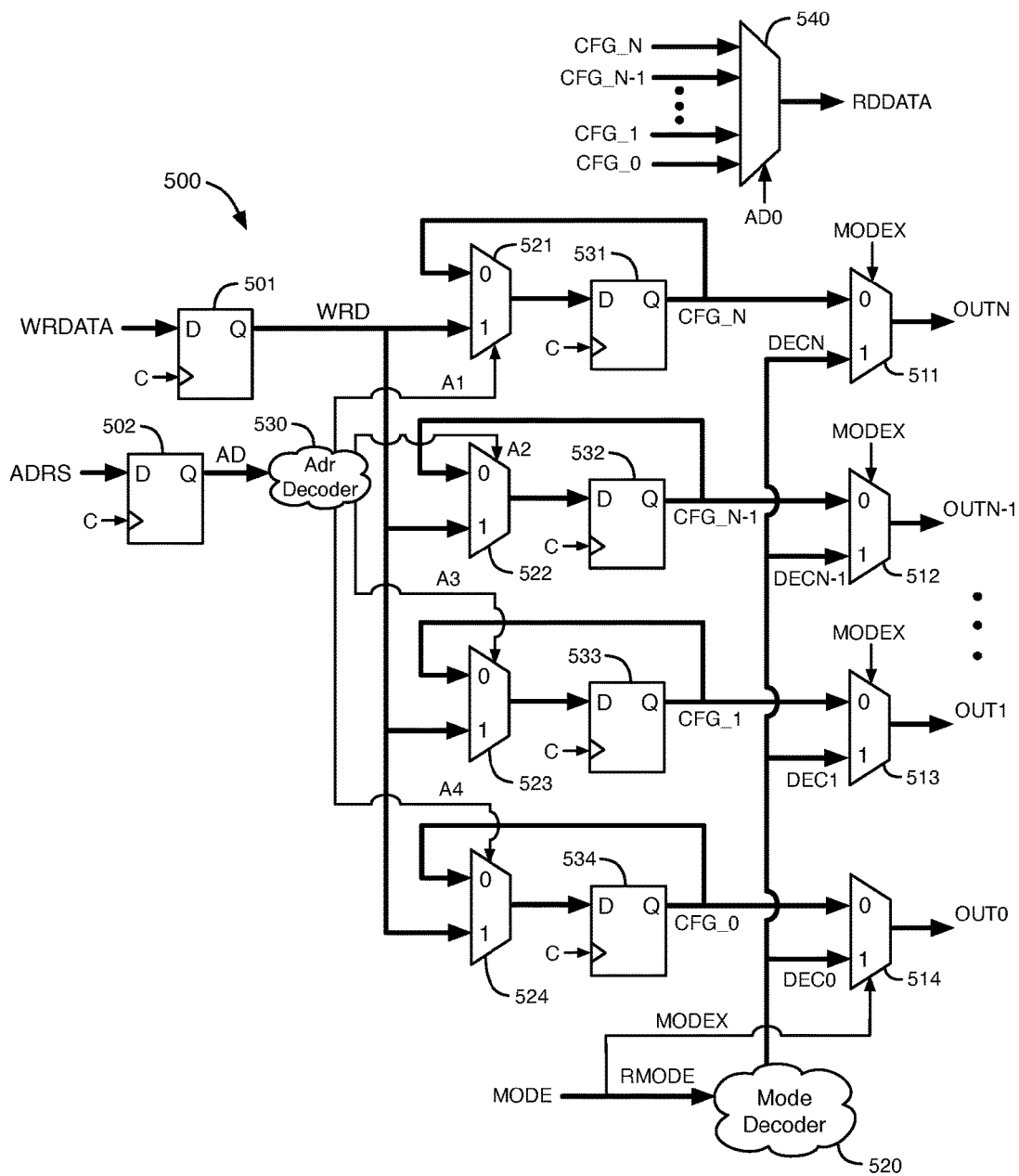
FIG. 5 illustrates an example of a configuration status register (CSR) block in a hard intellectual property (HIP) block that does not have a mode register, according to an embodiment.

FIG. 3 illustrates an example of a configuration status register (CSR) block 300 in a hard intellectual property (HIP) circuit block having a mode register, according to an embodiment. CSR block 300 includes write data register circuit 301, address register circuit 302, configuration status register (CSR) circuits 331-334, mode register circuit 335, mode decoder circuit 320, address decoder circuit 330, and multiplexer circuits 311-314 and 321-325. CSR block 300 is an example of each of the CSR blocks 211-216 shown in FIG. 2. Register circuits 301-302 and 331-335 are clocked by one or more clock signals C. In FIGS. 3-5, the bold lines may be multi-bit or single bit signal lines or busses. Each of the register circuits 301-302 and 331-335 may include one, two, or more storage circuits (e.g., one or more flip-flops) that store one, two, or more bits at a time. Each of the multiplexer circuits 311-314 and 321-325 may include one, two, or more 2-to-1 multiplexer circuits.

A software or hardware tool 250 generates configuration, mode, and address bits for programming the programmable circuit features of one or more hard intellectual property (HIP) circuit blocks in an integrated circuit (IC). In the example of FIG. 3, the configuration and mode bits for programming the programmable circuit features of the HIP circuit block are transmitted to CSR block 300 as write data signals WRDATA. The write data signals WRDATA indicate the configuration bits and mode bits that are used to program the programmable circuit features of the HIP block. The address bits are transmitted as address signals ADRS. The address signals ADRS indicate address bits that identify which of the configuration status registers 331-334 are to receive bits from the write data signals WRDATA.

The configuration bits and the mode bits indicated by the write data signals WRDATA are stored in register circuit 301 as parallel signals WRD. A unique subset of the signals WRD that indicate a unique subset of the configuration bits is provided to the 0 input of each of multiplexer circuits 311-314. Each of the multiplexer circuits 311-314 receives a different and unique subset of signals WRD and thus receives a different and unique subset of the configuration bits indicated by signals WRD. Each subset of the configuration bits provided to multiplexer circuits 311-314 is used to configure a different subset of the programmable features of the HIP block. The mode bits are provided to the 1 input of multiplexer circuit 325. The address bits indicated by the address signals ADRS are stored in register circuit 302 as signals AD. Signals AD indicating the address bits are provided to address decoder 330.

One of the mode bits is used as a mode control signal MODEX. The mode control signal MODEX is provided to the select input of each of multiplexer circuits 311-314. Signal MODEX controls the selection of multiplexer circuits 311-314. The MODEX control signal is set to logic 0, except when the mode of the HIP circuit block is to be changed to a different mode. In response to the MODEX signal being logic 0, multiplexer circuits 311-314 provide the respective subsets of the configuration bits that they receive from register circuit 301 as signals WRD to the 1 inputs of multiplexer circuits 321-324, respectively.

The address decoder circuit 330 decodes the address bits received from register circuit 302 to generate decoded address control signals A1-A4. Address control signals A1-A4 are provided to the select inputs of multiplexer circuits 321-324, respectively, as shown in FIG. 3. Address control signals A1-A4 control the selection of multiplexer circuits 321-324, respectively. In response to one or more of the address control signals A1-A4 being set to logic 1, the respective ones of the multiplexer circuits 321-324 provide the respective subsets of the configuration bits received from register circuit 301 to the D inputs of the respective ones of the configuration status registers 331-334. The configuration status registers 331-334 store the respective subsets of the configuration bits as output signals CFG_N, CFG_N−1, CFG_1, and CFG_0, respectively, at their Q outputs.

In some embodiments, CSR block 300 may include additional configuration status register circuits and additional corresponding multiplexer circuits, as indicated by the two sets of three dots in FIG. 3. The configuration bits indicated by output signals CFG_N, CFG_N−1, CFG_1, and CFG_0 configure programmable circuit features within the HIP circuit block. As an example, signals CFG_N, CFG_N−1, an additional set of configuration bits in signals CFG_N−2 not shown in FIG. 3, CFG_1, and CFG_0 may be provided as the configuration signals C4, C3, C2, C1, and C0, respectively, shown in FIG. 1 that program the configurable circuit features of HIP circuit block 100.

In response to one or more of the address control signals A1-A4 being set to logic 0, the respective ones of the multiplexer circuits 321-324 feed the output signals CFG_N, CFG_N−1, CFG_1, and CFG_0 of the respective ones of the configuration status registers (CSRs) 331-334 back to the D inputs of the respective CSRs 331-334. As such, setting a respective one of the address control signals A1-A4 to logic 0 creates a feedback loop circuit that causes the respective one of the CSRs 331-334 to maintain the current values of the configuration bits at its Q output.

As an example, if the logic states of the address control signals A1-A4 are set to 1100, respectively, and the MODEX signal is logic 0, then multiplexer circuits 311-312 and 321-322 provide first and second subsets of the configuration bits indicated by signals WRD to CSRs 331-332, respectively, and multiplexer circuits 323-324 feed back the output signals CFG_1 and CFG_0 to the D inputs of CSRs 333-334, respectively, causing the values of signals CFG_1 and CFG_0 to remain the same. CSRs 331-332 then store the first and second subsets of the configuration bits as signals CFG_N and CFG_N−1, respectively, in the next clock cycle.

A select signal SL is provided to the select input of multiplexer circuit 325. Select signal SL controls the selection of multiplexer circuit 325. In response to the select signal SL being logic 1, multiplexer circuit 325 provides the mode bits received from register circuit 301 to the D input of mode register circuit 335. The mode bits are used to set or change a mode of the HIP circuit block that contains CSR block 300. The mode register circuit 335 stores the mode bits at its Q output as mode signals MODE. Signal MODEX is one of the mode signals MODE that indicates one of the mode bits. Signal MODEX is provided to the select inputs of multiplexer circuits 311-314, as described above. The rest of the mode signals RMODE indicating the remaining mode bits are provided to inputs of the mode decoder circuit 320.

The mode decoder circuit 320 decodes the remaining mode bits indicated by the rest of the mode signals RMODE to generate sets of decoded signals DEC_N, DEC_N−1, DEC_1, and DEC_0. Mode decoder circuit 320 may also generate additional decoded signals if there are additional configuration status registers in CSR block 300. Mode decoder circuit 320 may, for example, generate values for the decoded signals by retrieving values from a look-up table (LUT) circuit 360 in response to the values of the remaining mode bits indicated by the rest of the mode signals RMODE. The decoded signals DEC_N, DEC_N−1, DEC_1, and DEC_0 indicate configuration bits that are to be stored in the configuration status registers 331-334, respectively, in order to change the mode of the HIP circuit block to the mode indicated by the remaining mode bits in signals RMODE.

When the mode of the HIP circuit block is to be changed from a first mode to a second mode, an updated set of mode bits is transmitted to CSR block 300 in signals WRDATA, and the select signal SL is set to logic 1. The updated set of mode bits indicates values that identify the second mode. The updated set of mode bits is provided to and stored in mode register circuit 335 through multiplexer circuit 325 as the MODE signals. The MODE signals include a logic 1 value for signal MODEX that is provided to the select inputs of multiplexer circuits 311-314. In response to the values of the remaining RMODE signals, mode decoder circuit 320 generates values for the decoded signals DEC_N, DEC_N−1, DEC_1, and DEC_0 that correspond to the second mode.

In response to signal MODEX being logic 1, multiplexer circuits 311-314 provide the values of the decoded signals DEC_N, DEC_N−1, DEC_1, and DEC_0 to the 1 inputs of multiplexer circuits 321-324, respectively. The multiplexer circuits 321-324 receiving respective address bits A1-A4 that are set to logic 1 provide the values of the decoded signals DEC_N, DEC_N−1, DEC_1, and DEC_0 to CSRs 331-334, respectively. The CSRs 331-334 that receive values for the respective decoded signals DEC_N, DEC_N−1, DEC_1, and DEC_0 store these values as updated output signals CFG_N, CFG_N−1, CFG_1, and CFG_0, respectively. The output signals CFG_N, CFG_N−1, CFG_1, and CFG_0 that are changed to indicate values of the respective decoded signals DEC_N, DEC_N−1, DEC_1, and DEC_0 re-program respective subsets of the programmable circuit features of the HIP circuit block in order to implement the second mode of the HIP circuit block.

The select signal SL is set to logic 0 to maintain the values of the mode bits stored at the Q output of mode register circuit 335 constant by coupling a feedback loop to mode register circuit 335 through multiplexer circuit 325. The select signal SL is maintained at a logic 0 until the mode of the HIP circuit block is to be changed again.

Any of the address bits A1-A4 may be set to logic 0 to prevent the values of the respective decoded signals DEC_N, DEC_N−1, DEC_1, and DEC_0 from being transmitted to the respective CSR circuits 331-334. If any of the address bits A1-A4 are set to logic 0, the respective CSR circuits 331-334 maintain the same values of the configuration bits stored at their Q outputs through feedback loops, as described above, and the programmable circuit features of the HIP circuit block controlled by these configuration bits are not reprogrammed.

Thus, the configuration bits that are used to implement a mode change are generated by decoder 320 (or stored in circuitry in the IC that contains CSR block 300), rather than being generated by external software, which reduces errors in the configuration bits. If only a subset of the configuration bits are different between different modes, the mode decoder circuit 320 only changes this subset of the configuration bits to implement a mode change for the HIP circuit block.

As a specific example of how the mode bits may be changed, HIP circuit block 100 shown in FIG. 1 may operate in any one of 4 different programmable modes, referred to as FIFO bypass mode, block A FIFO mode, block B FIFO mode, and disabled. In this example, the mode bits include 2 binary bits that indicate the 4 modes. Table 1 below shows the values of the configuration bits C4, C3, C2, C1, and C0 that enable these 4 modes.

TABLE 1

| Mode Number | Mode Name | C4, C3, C2, C1, C0 |
| --- | --- | --- |
| 1 | FIFO Bypass mode | 00000 |
| 2 | Block A FIFO mode | 01110 |
| 3 | Block B FIFO mode | 11111 |
| 4 | Disabled | 00010 |

In mode 1, as shown in Table 1, all of bits C0-C4 are logic 0. In mode 1, data from the DATAC signals is processed by logic 120 and then provided to the DOUT signals, bypassing FIFO 110, as described above with respect to FIG. 1. In order to change from mode 1 to mode 2, configuration bits C4, C3, C2, C1, and C0 are changed from 00000 to 01110, respectively, as shown in Table 1. In mode 2, data is provided through FIFO 110 from data input signals DATAA to the data output signals DOUT, as described above with respect to FIG. 1.

In order to change the mode of the HIP circuit block 100 from mode 1 to mode 2, the mode bits indicated by a subset of signals WRDATA are changed from a first value that indicates mode 1 to a second value that indicates mode 2. Mode register circuit 335 then changes the RMODE signals from the first value to the second value that indicates mode 2, and the mode bit for the MODEX signal is asserted to logic 1.

In this example, configuration bits C4, C3, C2, C1, and C0 are stored in CSR 331, CSR 332, an additional CSR not shown in FIG. 3, CSR 333, and CSR 334, respectively. Because configuration bits C0 and C4 remain logic 0 when changing from mode 1 to mode 2, address bits A1 and A4 may be set to logic 0 to cause signals CFG_N and CFG_0 to maintain the same values. Because configuration bits C1-C3 change from logic 0 to logic 1 when changing from mode 1 to mode 2, address bits A2-A3 and a third address bit (not shown) are set to logic 1 to cause configuration signals CFG_N-1, CFG_N-2 (not shown), and CFG_1 to update.

In response to the RMODE signals changing to the second value, decoder circuit 320 changes each of the decoded signals DEC_N-1 . . . DEC_1 to logic 1. The logic is indicated by decoded signals DEC_N-1 . . . DEC_1 are provided to CSRs 332 . . . 333 through multiplexer circuits 312 . . . 313 and 322 . . . 323, respectively. As a result, the configuration signals CFG_N-1, CFG_N-2, and CFG_1 each transition from logic 0 to logic 1 to reprogram the programmable circuit features of HIP circuit block 100 that are needed to implement mode 2, as discussed above. Signals CFG_N-1, CFG_N-2, and CFG_1 indicate configuration bits C3, C2, and C1, respectively, in this example.

In some embodiments, only a subset of the storage circuits in the configuration status registers (CSRs) 331-334 store configuration bits that change between any 2 allowable modes of the HIP circuit block. The mode decoder circuit 320 may only be coupled through multiplexer circuits to this subset of the storage circuits in the configuration status registers. As a specific example that is not intended to be limiting, if each of the 4 CSRs 331-334 has 32 flip-flops that store 32 configuration bits, decoder circuit 320 may only be coupled to 5 of these flip-flops in each of the CSRs 331-334 through the multiplexer circuits 311-314 and 321-324, because only 5 of the 32 configuration bits stored in each of the CSRs 331-334 can be changed between any 2 allowable modes of the HIP circuit block. This feature may substantially reduce the amount of wires and circuitry in the CSR block 300.

The circuitry and techniques disclosed herein reduce the amount of design intent that is required for software to process and program. Instead of programming multiple multi-bit register fields in multiple HIP circuit blocks, software may be able to write one common set of mode bits into the mode register in each HIP circuit block to implement a desired mode. This technique also may provide the benefit of enabling silicon validation engineers to manually program a relatively small number of mode registers, rather than being dependent on software tools to perform long compilations and error prone translations to change configuration bits from one mode to another mode.

FIG. 4 illustrates a transceiver circuit having hard intellectual property (HIP) circuit blocks in an integrated circuit, according to another embodiment. The circuitry shown in FIG. 4 is a transceiver circuit that includes 6 HIP circuit blocks 401-406 and two serializer-deserializer (SerDes) circuit blocks 407-408. Data may be transmitted through the transceiver circuit, for example, from HIP circuit blocks 401-402 through logic in HIP circuit blocks 403 and 404 and through HIP circuit blocks 405-406 to SerDes blocks 407-408, as shown in FIG. 4. The integrated circuit (IC) may be, for example, a programmable IC or any other type of IC, such as a microprocessor or graphics processing unit.

In the system of FIG. 4, each hard IP circuit block has a configuration status register (CSR) block, as with the embodiment of FIG. 2. HIP circuit blocks 401-406 include CSR blocks 411-416, respectively, as shown in FIG. 4. In contrast with the embodiment of FIG. 2, CSR blocks 411-416 in the embodiment of FIG. 4 do not include mode registers that store mode bits. Instead, the transceiver circuit of FIG. 4 includes a global mode register circuit 400 that functions as the mode register for each of the CSR blocks 411-416. The global mode register circuit 400 stores the mode bits for each of the CSR blocks 411-416 in HIP circuit blocks 401-406, respectively. Global mode register 400 may receive the mode bits as signals MD from a bit stream generator device 450, which may be, for example, a software tool running on a computer that is external to the IC that contains the other circuitry shown in FIG. 4.

After the mode bits are stored in the global mode register 400, the mode bits are transmitted to a mode decoder in each of the CSR blocks 411-416. The mode bits are transmitted to CSR blocks 411-416 as mode signals MODE1A, MODE1B, MODE2, MODE3, MODE4A, and MODE4B, respectively. Each set of the mode signals MODE1A, MODE1B, MODE2, MODE3, MODE4A, and MODE4B may indicate all of the mode bits stored in the mode register 400. Alternatively, the mode signals MODE1A, MODE1B, MODE2, MODE3, MODE4A, and MODE4B may indicate different subsets of the mode bits stored in the mode register 400. The mode decoder in each of the CSR blocks 411-416 decodes the mode bits to generate a set of mode specific configuration bits to be stored in one or more of the configuration status registers. The decoded configuration bits are used to provide the circuit selection controls and enables for the modes of HIP blocks 401-406. These modes can be more easily verified with the HDL models, and as a result, they can reduce efforts to verify a full design intent.

FIG. 5 illustrates an example of a configuration status register (CSR) block 500 in a hard intellectual property (HIP) circuit block that does not have a mode register, according to an embodiment. CSR block 500 includes write data register circuit 501, address register circuit 502, configuration status register (CSR) circuits 531-534, mode decoder circuit 520, address decoder circuit 530, and multiplexer circuits 511-514 and 521-524. CSR block 500 is an example of each of the CSR blocks 411-416 shown in FIG. 4. Register circuits 501-502 and 531-534 are clocked by one or more clock signals C. In the embodiment of FIG. 5, mode decoder circuit 520 provides decoded configuration bits to multiplexer circuits 511-514 that are coupled to the outputs of CSRs 531-534, respectively, rather than providing decoded configuration bits to inputs of the CSRs through multiplexer circuits, as in the embodiment of FIG. 3.

In the embodiment of FIG. 5, the configuration bits for programming the programmable circuit features of the HIP circuit block are transmitted to CSR block 500 as write data signals WRDATA and address signals ADRS, as in the embodiment of FIG. 3. The configuration bits indicated by the write data signals WRDATA are stored in register circuit 501 as signals WRD. The write data signals WRDATA do not include the mode bits. A unique subset of signals WRD that indicate a unique subset of the configuration bits is provided to the 1 input of each of multiplexer circuits 521-524. The address bits indicated by the address signals ADRS are stored in register circuit 502 as signals AD. Signals AD indicating the address bits are provided to address decoder 530.

Address decoder 530 decodes the address bits to generate address control signals A1-A4 that are provided to select inputs of multiplexer circuits 521-524, respectively. In response to one or more of the address control signals A1-A4 being set to logic 1, the respective ones of the multiplexer circuits 521-524 provide the respective subsets of the configuration bits received from register circuit 501 to the D inputs of respective ones of the configuration status registers 531-534. The configuration status registers 531-534 store the respective subsets of the configuration bits as output signals CFG_N, CFG_N−1, CFG_1, and CFG_0, respectively, at their Q outputs.

In response to one or more of the address control signals A1-A4 being set to logic 0, the respective ones of the multiplexer circuits 521-524 feed the output signals CFG_N, CFG_N−1, CFG_1, and CFG_0 of the respective ones of the configuration status registers (CSRs) 531-534 back to the D inputs of the respective CSRs. As such, setting a respective one of the address control signals A1-A4 to logic 0 creates a feedback loop that causes the respective one of the CSRs 531-534 to maintain the current values of the configuration bits at its Q output.

Mode signals indicating the mode bits are provided from global mode register 400 to CSR block 500, as disclosed herein with respect to FIG. 4. The mode signals are identified as MODE signals in FIG. 5. The mode signals MODE that indicate the mode bits include mode control signal MODEX and the remaining mode signals RMODE. The mode control signal MODEX is provided to the select input of each of multiplexer circuits 511-514 to control the selection of multiplexer circuits 511-514. The remaining mode signals RMODE are provided to inputs of mode decoder circuit 520.

The MODEX signal is set to logic 0, except when the mode of the HIP circuit block is to be changed. In response to the MODEX signal being a logic 0, multiplexer circuits 511-514 provide the configuration bits indicated by the output signals CFG_N, CFG_N−1, CFG_1, and CFG_0 of CSRs 531-534 as output signals OUTN, OUTN−1, OUT1, and OUT0, respectively.

The mode decoder circuit 520 decodes the rest of the mode signals RMODE to generate sets of decoded signals DECN, DECN−1, DEC1, and DEC0 that are provided to the 1 inputs of multiplexer circuits 511-514, respectively. The decoded signals DECN, DECN−1, DEC1, and DEC0 indicate configuration bits that change the mode of the HIP circuit block to the mode indicated by the remaining mode signals RMODE. Mode decoder circuit 520 may, for example, generate values for the decoded signals by retrieving values from a look-up table in response to the values of the mode signals RMODE.

When the mode of the HIP circuit block is to be changed from a first mode to a second mode, updated values of the mode bits are transmitted to CSR block 500 in signals MODE from global mode register 400. The updated values of the mode bits identify the second mode. The updated mode bits include a logic 1 value for signal MODEX that is provided to multiplexer circuits 511-514. In response to the updated values of the remaining RMODE signals, mode decoder circuit 520 generates updated values for one or more of the decoded signals DECN, DECN−1, DEC1, and DEC0 that correspond to the second mode.

In response to signal MODEX being logic 1, multiplexer circuits 511-514 provide the values of the decoded signals DECN, DECN−1, DEC1, and DEC0 to their outputs as output signals OUTN, OUTN−1, OUT1, and OUT0, respectively. The output signals OUTN, OUTN−1, OUT1, and OUT0 that are changed to indicate the updated values of the respective decoded signals DECN, DECN−1, DEC1, and DEC0 re-program respective subsets of the programmable circuit features of the HIP circuit block in order to implement the second mode. Thus, in the embodiment of FIG. 5, mode decoder circuit 520 provides decoded configuration bits through multiplexer circuits 511-514 to the programmable circuit features of the HIP circuit block that are re-programmed in response to a mode change, without traversing the CSRs 531-534.

In some embodiments, only a subset of the storage circuits in the configuration status registers (CSRs) 531-534 store configuration bits that change between any 2 allowable modes of the HIP circuit block. The mode decoder circuit 520 may only be coupled to the multiplexer circuits 511-514 that output the configuration bits that change between any 2 allowable modes of the HIP circuit block. As a specific example that is not intended to be limiting, if each of the 4 CSRs 531-534 has 32 flip-flops that store 32 configuration bits, mode decoder 520 may only be coupled to provide 6 decoded signals to 6 multiplexer circuits in each of the 4 sets of multiplexer circuits 511-514. In this example, only 6 of the 32 configuration bits output by each of the 4 multiplexer circuits 511-514 can be changed between any 2 allowable modes of the HIP circuit block. This feature may substantially reduce the wires and circuitry in CSR block 500.

CSR block 500 also includes multiplexer circuit 540. Multiplexer circuit 540 receives each set of output signals CFG_N, CFG_N−1, CFG_1, and CFG_0 of CSRs 531-534, respectively. Multiplexer circuit 540 provides one set of the output signals CFG_N, CFG_N−1, CFG_1, and CFG_0 of CSRs 531-534 as read data signals RDDATA in response to select signals AD0 generated by address decoder circuit 530.

Figure 6:
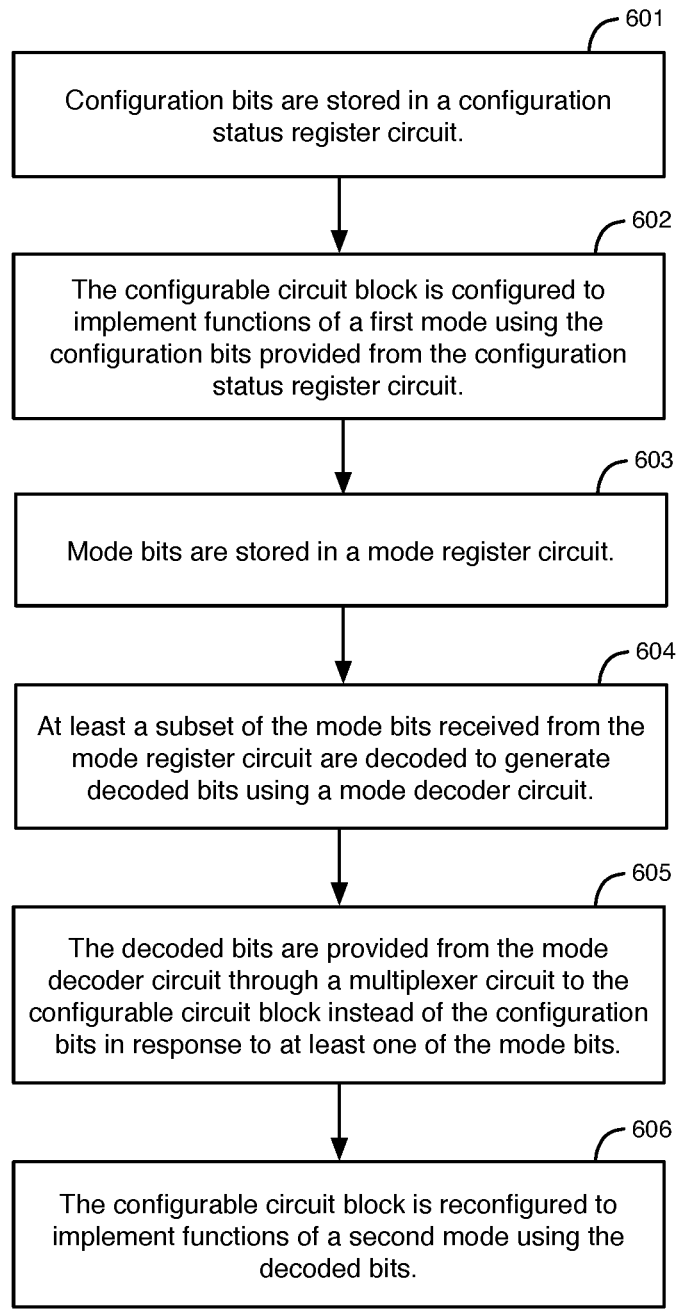
FIG. 6 illustrates a flow chart that shows operations for changing a mode of a configurable circuit block, according to an embodiment.

FIG. 6 illustrates a flow chart that shows operations for changing a mode of a configurable circuit block, according to an embodiment. The configurable circuit block may be, for example, a HIP circuit block, such as one of HIP circuit blocks 201-206 or 401-406. In operation 601, configuration bits are stored in a configuration status register circuit. The configuration status register circuit may be, for example, one of CSRs 331-334 or 531-534. In operation 602, the configurable circuit block is configured to implement functions of a first mode using the configuration bits provided from the configuration status register circuit. In operation 603, mode bits are stored in a mode register circuit. The mode register circuit may be, for example, one of mode register circuits 335 or 400. In operation 604, at least a subset of the mode bits received from the mode register circuit are decoded to generate decoded bits using a mode decoder circuit. The mode decoder circuit may be, for example, one of mode decoder circuits 320 or 520. In operation 605, the decoded bits are provided from the mode decoder circuit through a multiplexer circuit to the configurable circuit block instead of the configuration bits in response to at least one of the mode bits. The multiplexer circuit may be, for example, one of multiplexer circuits 311-314 or 511-514. In operation 606, the configurable circuit block is reconfigured to implement functions of a second mode using the decoded bits.

The embodiments disclosed herein may be incorporated into any suitable integrated circuit. For example, the embodiments may be incorporated into numerous types of devices such as programmable logic integrated circuits, application specific standard products (ASSPs), and application specific integrated circuits (ASICs). Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The integrated circuits can be used to perform a variety of different logic functions. For example, a programmable logic integrated circuit can be configured as a processor or controller that works in cooperation with a system processor. A programmable logic integrated circuit may also be used as an arbiter for arbitrating access to a shared resource in the data processing system. In yet another example, a programmable logic integrated circuit can be configured as an interface between a processor and one of the other components in the system.

The following examples pertain to further embodiments.

Example 1 is an integrated circuit comprising: programmable circuits; a configuration status register circuit that stores configuration bits and that is coupled to provide the configuration bits to the programmable circuits to program the programmable circuits to implement functions of a first mode; a mode register circuit coupled to store mode bits; a mode decoder circuit that decodes at least a subset of the mode bits received from the mode register circuit to generate decoded bits; and a first multiplexer circuit that provides the decoded bits from the mode decoder circuit to the programmable circuits to reprogram the programmable circuits to implement functions of a second mode in response to at least one of the mode bits.

In Example 2, the subject matter of Example 1 can optionally further include an address register circuit coupled to store address bits; an address decoder circuit coupled to receive the address bits from the address register circuit and to decode the address bits to generate a decoded address bit; and a second multiplexer circuit that provides the configuration bits to the configuration status register circuit in response to the decoded address bit from either a first input of the second multiplexer circuit or from a second input of the second multiplexer circuit that is coupled to an output of the configuration status register circuit.

In Example 3, the subject matter of any one of Examples 1-2 can optionally further include a write data register circuit coupled to store the configuration bits, wherein the configuration bits are provided from an output of the write data register circuit to the configuration status register circuit to program the programmable circuits to implement the functions of the first mode.

In Example 4, the subject matter of Example 3 can optionally further include a second multiplexer circuit comprising an output that is coupled to an input of the configuration status register circuit, wherein the first multiplexer circuit is coupled to an output of the write data register circuit, the mode decoder circuit, and a first input of the second multiplexer circuit, wherein the second multiplexer circuit further comprises a second input that is coupled to an output of the configuration status register circuit.

In Example 5, the subject matter of Example 3 can optionally further include a second multiplexer circuit comprising a first input that is coupled to an output of the write data register circuit and an output that is coupled to an input of the configuration status register circuit, wherein a first input of the first multiplexer circuit is coupled to an output of the configuration status register circuit, and wherein a second input of the first multiplexer circuit is coupled to the mode decoder circuit.

In Example 6, the subject matter of Example 1 can optionally include wherein the programmable circuits, the configuration status register circuit, the mode decoder circuit, and the first multiplexer circuit are all in a first configurable circuit block.

In Example 7, the subject matter of Example 6 can optionally further include a second configurable circuit block that comprises additional programmable circuits, an additional mode decoder circuit, a second multiplexer circuit, and an additional configuration status register circuit, wherein the mode register circuit is a global mode register circuit that is coupled to provide at least a subset of the modes bits to the mode decoder circuit and to the additional mode decoder circuit.

In Example 8, the subject matter of Example 7 can optionally include wherein an input of the second multiplexer circuit is coupled to an output of the additional configuration status register circuit, wherein the additional mode decoder circuit generates additional decoded bits based on the mode bits, and wherein the second multiplexer circuit is coupled to provide the additional decoded bits to reprogram the additional programmable circuits to implement functions of the second mode.

In Example 9, the subject matter of Example 6 can optionally include wherein the mode register circuit is in the first configurable circuit block.

In Example 10, the subject matter of any one of Examples 1-9 can optionally include wherein the integrated circuit is a programmable logic integrated circuit, and wherein the programmable circuits are programmable logic circuits.

In Example 11, the subject matter of any one of Examples 1-10 can optionally further include an additional configuration status register circuit that stores additional configuration bits and that is coupled to provide the additional configuration bits to the programmable circuits to program the programmable circuits to implement the functions of the first mode, wherein the mode decoder circuit decodes the subset of the mode bits to generate additional decoded bits; and a second multiplexer circuit that provides the additional decoded bits from the mode decoder circuit to the programmable circuits to reprogram the programmable circuits to implement the functions of the second mode in response to the at least one of the mode bits.

Example 12 is a method for changing a mode of a configurable circuit block, the method comprising: storing configuration bits in a configuration status register circuit; configuring the configurable circuit block to implement functions of a first mode using the configuration bits provided from the configuration status register circuit; storing mode bits in a mode register circuit; decoding at least a subset of the mode bits received from the mode register circuit to generate decoded bits using a mode decoder circuit; providing the decoded bits from the mode decoder circuit through a first multiplexer circuit to the configurable circuit block instead of the configuration bits in response to at least one of the mode bits; and reconfiguring the configurable circuit block to implement functions of a second mode using the decoded bits.

In Example 13, the subject matter of Example 12 can optionally further include providing the configuration bits to the configuration status register circuit from either an output of a write data register circuit or from an output of the configuration status register circuit through a second multiplexer circuit in response to a decoded address bit.

In Example 14, the subject matter of Example 13 can optionally further include storing address bits in an address register circuit; and decoding the address bits received from the address register circuit using an address decoder circuit to generate the decoded address bit.

In Example 15, the subject matter of any one of Examples 12-14 can optionally further include storing additional configuration bits in an additional configuration status register circuit; configuring an additional configurable circuit block to implement the functions of the first mode using the additional configuration bits provided from the additional configuration status register circuit; decoding the subset of the mode bits received from the mode register circuit to generate additional decoded bits using an additional mode decoder circuit; providing the additional decoded bits from the additional mode decoder circuit through a second multiplexer circuit to the additional configurable circuit block instead of the additional configuration bits in response to the at least one of the mode bits; and reconfiguring the additional configurable circuit block to implement the functions of the second mode using the additional decoded bits.

In Example 16, the subject matter of Example 12 can optionally include wherein providing the decoded bits from the mode decoder circuit through the first multiplexer circuit to the configurable circuit block instead of the configuration bits in response to at least one of the mode bits further comprises providing the decoded bits through the first multiplexer circuit to the configuration status register circuit.

Example 17 is a computer readable non-transitory medium storing executable instructions for changing a mode of a configurable circuit block, the executable instructions comprising: instructions executable to store configuration bits in a configuration status register circuit; instructions executable to configure the configurable circuit block to implement functions of a first mode using the configuration bits provided from the configuration status register circuit; instructions executable to store mode bits in a mode register circuit; instructions executable to decode at least a subset of the mode bits received from the mode register circuit to generate decoded bits using a mode decoder circuit; instructions executable to provide the decoded bits from the mode decoder circuit through a first multiplexer circuit to the configurable circuit block instead of the configuration bits in response to at least one of the mode bits; and instructions executable to reconfigure the configurable circuit block to implement functions of a second mode using the decoded bits.

In Example 18, the subject matter of Example 17 can optionally further include instructions executable to provide the configuration bits to the configuration status register circuit from either an output of a write data register circuit or from an output of the configuration status register circuit in response to a decoded address bit using a second multiplexer circuit.

In Example 19, the subject matter of Example 18 can optionally further include instructions executable to store address bits in an address register circuit; and instructions executable to decode the address bits received from the address register circuit using an address decoder circuit to generate the decoded address bit.

In Example 20, the subject matter of any one of Examples 17-19 can optionally further include instructions executable to store additional configuration bits in an additional configuration status register circuit; instructions executable to configure an additional configurable circuit block to implement the functions of the first mode using the additional configuration bits provided from the additional configuration status register circuit; instructions executable to decode the subset of the mode bits received from the mode register circuit to generate additional decoded bits using an additional mode decoder circuit; instructions executable to provide the additional decoded bits from the additional mode decoder circuit through a second multiplexer circuit to the additional configurable circuit block instead of the additional configuration bits in response to the at least one of the mode bits; and instructions executable to reconfigure the additional configurable circuit block to implement the functions of the second mode using the additional decoded bits.

In Example 21, the subject matter of any one of Examples 17-20 can optionally include wherein the instructions executable to provide the decoded bits from the mode decoder circuit through the first multiplexer circuit to the configurable circuit block further comprises instructions executable to provide the decoded bits through the first multiplexer circuit to the configuration status register circuit.

Example 22 is an integrated circuit comprising: means for storing configuration bits and providing the configuration bits to programmable circuits to program the programmable circuits to implement functions of a first mode; means for storing mode bits; first means for decoding at least a subset of the mode bits received from the means for storing the mode bits to generate decoded bits; and means for providing the decoded bits from the first means for decoding to the programmable circuits instead of the configuration bits to reprogram the programmable circuits to implement functions of a second mode in response to at least one of the mode bits.

In Example 23, the subject matter of Example 22 can optionally further include means for storing address bits; means for decoding the address bits to generate a decoded address bit; and means for providing the configuration bits to the means for storing the configuration bits from either an output of a write data register circuit or from an output of the means for storing the configuration bits in response to the decoded address bit.

In Example 24, the subject matter of any one of Examples 22-23 can optionally include wherein the means for providing the decoded bits from the first means for decoding to the programmable circuits further comprises means for providing the decoded bits to the means for storing the configuration bits.

In Example 25, the subject matter of any one of Examples 22-24 can optionally further include means for storing additional configuration bits and providing the additional configuration bits to additional programmable circuits to program the additional programmable circuits to implement the functions of the first mode; second means for decoding the subset of the mode bits received from the means for storing the mode bits to generate additional decoded bits; means for providing the additional decoded bits from the second means for decoding to the additional programmable circuits instead of the additional configuration bits in response to the at least one of the mode bits; and means for reprogramming the additional programmable circuits to implement the functions of the second mode using the additional decoded bits.

In Example 26, the subject matter of any one of Examples 22-25 can optionally include wherein the means for providing the decoded bits from the first means for decoding to the programmable circuits further comprises means for providing the decoded bits to the programmable circuits without providing the decoded bits through the means for storing the configuration bits.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   programmable circuits;
   a configuration status register circuit that stores configuration bits and that is coupled to provide the configuration bits to the programmable circuits to program the programmable circuits to implement functions of a first mode;
   a mode register circuit coupled to store mode bits;
   a mode decoder circuit that decodes at least a subset of the mode bits received from the mode register circuit to generate decoded bits; and
   a first multiplexer circuit that provides the decoded bits from the mode decoder circuit to the programmable circuits to reprogram the programmable circuits to implement functions of a second mode in response to at least one of the mode bits.

2. The integrated circuit of claim 1 further comprising:
   an address register circuit coupled to store address bits;
   an address decoder circuit coupled to receive the address bits from the address register circuit and to decode the address bits to generate a decoded address bit; and
   a second multiplexer circuit that provides the configuration bits to the configuration status register circuit in response to the decoded address bit from either a first input of the second multiplexer circuit or from a second input of the second multiplexer circuit that is coupled to an output of the configuration status register circuit.

3. The integrated circuit of claim 1 further comprising:
   a write data register circuit coupled to store the configuration bits, wherein the configuration bits are provided from an output of the write data register circuit to the configuration status register circuit to program the programmable circuits to implement the functions of the first mode.

4. The integrated circuit of claim 3 further comprising:
   a second multiplexer circuit comprising an output that is coupled to an input of the configuration status register circuit, wherein the first multiplexer circuit is coupled to an output of the write data register circuit, the mode decoder circuit, and a first input of the second multiplexer circuit, wherein the second multiplexer circuit further comprises a second input that is coupled to an output of the configuration status register circuit.

5. The integrated circuit of claim 3 further comprising:
   a second multiplexer circuit comprising a first input that is coupled to an output of the write data register circuit and an output that is coupled to an input of the configuration status register circuit,
   wherein a first input of the first multiplexer circuit is coupled to an output of the configuration status register circuit, and wherein a second input of the first multiplexer circuit is coupled to the mode decoder circuit.

6. The integrated circuit of claim 1, wherein the programmable circuits, the configuration status register circuit, the mode decoder circuit, and the first multiplexer circuit are all in a first configurable circuit block.

7. The integrated circuit of claim 6 further comprising:
   a second configurable circuit block that comprises additional programmable circuits, an additional mode decoder circuit, a second multiplexer circuit, and an additional configuration status register circuit,
   wherein the mode register circuit is a global mode register circuit that is coupled to provide at least a subset of the modes bits to the mode decoder circuit and to the additional mode decoder circuit.

8. The integrated circuit of claim 7, wherein an input of the second multiplexer circuit is coupled to an output of the additional configuration status register circuit, wherein the additional mode decoder circuit generates additional decoded bits based on the mode bits, and wherein the second multiplexer circuit is coupled to provide the additional decoded bits to reprogram the additional programmable circuits to implement functions of the second mode.

9. The integrated circuit of claim 6, wherein the mode register circuit is in the first configurable circuit block.

10. The integrated circuit of claim 1, wherein the integrated circuit is a programmable logic integrated circuit, and wherein the programmable circuits are programmable logic circuits.

11. The integrated circuit of claim 1 further comprising:
an additional configuration status register circuit that stores additional configuration bits and that is coupled to provide the additional configuration bits to the programmable circuits to program the programmable circuits to implement the functions of the first mode, wherein the mode decoder circuit decodes the subset of the mode bits to generate additional decoded bits; and
a second multiplexer circuit that provides the additional decoded bits from the mode decoder circuit to the programmable circuits to reprogram the programmable circuits to implement the functions of the second mode in response to the at least one of the mode bits.

12. A method for changing a mode of a configurable circuit block, the method comprising:
storing configuration bits in a configuration status register circuit;
configuring the configurable circuit block to implement functions of a first mode using the configuration bits provided from the configuration status register circuit;
storing mode bits in a mode register circuit;
decoding at least a subset of the mode bits received from the mode register circuit to generate decoded bits using a mode decoder circuit;
providing the decoded bits from the mode decoder circuit through a first multiplexer circuit to the configurable circuit block instead of the configuration bits in response to at least one of the mode bits; and
reconfiguring the configurable circuit block to implement functions of a second mode using the decoded bits.

13. The method of claim 12 further comprising:
providing the configuration bits to the configuration status register circuit from either an output of a write data register circuit or from an output of the configuration status register circuit through a second multiplexer circuit in response to a decoded address bit.

14. The method of claim 13 further comprising:
storing address bits in an address register circuit; and
decoding the address bits received from the address register circuit using an address decoder circuit to generate the decoded address bit.

15. The method of claim 12 further comprising:
storing additional configuration bits in an additional configuration status register circuit;
configuring an additional configurable circuit block to implement the functions of the first mode using the additional configuration bits provided from the additional configuration status register circuit;
decoding the subset of the mode bits received from the mode register circuit to generate additional decoded bits using an additional mode decoder circuit;
providing the additional decoded bits from the additional mode decoder circuit through a second multiplexer circuit to the additional configurable circuit block instead of the additional configuration bits in response to the at least one of the mode bits; and
reconfiguring the additional configurable circuit block to implement the functions of the second mode using the additional decoded bits.

16. The method of claim 12, wherein providing the decoded bits from the mode decoder circuit through the first multiplexer circuit to the configurable circuit block instead of the configuration bits in response to at least one of the mode bits further comprises providing the decoded bits through the first multiplexer circuit to the configuration status register circuit.

17. A computer readable non-transitory medium storing executable instructions for changing a mode of a configurable circuit block, the executable instructions comprising:
instructions executable to store configuration bits in a configuration status register circuit;
instructions executable to configure the configurable circuit block to implement functions of a first mode using the configuration bits provided from the configuration status register circuit;
instructions executable to store mode bits in a mode register circuit;
instructions executable to decode at least a subset of the mode bits received from the mode register circuit to generate decoded bits using a mode decoder circuit;
instructions executable to provide the decoded bits from the mode decoder circuit through a first multiplexer circuit to the configurable circuit block instead of the configuration bits in response to at least one of the mode bits; and
instructions executable to reconfigure the configurable circuit block to implement functions of a second mode using the decoded bits.

18. The computer readable non-transitory medium of claim 17 further comprising:
instructions executable to provide the configuration bits to the configuration status register circuit from either an output of a write data register circuit or from an output of the configuration status register circuit in response to a decoded address bit using a second multiplexer circuit.

19. The computer readable non-transitory medium of claim 18 further comprising:
instructions executable to store address bits in an address register circuit; and
instructions executable to decode the address bits received from the address register circuit using an address decoder circuit to generate the decoded address bit.

20. The computer readable non-transitory medium of claim 17 further comprising:
instructions executable to store additional configuration bits in an additional configuration status register circuit;
instructions executable to configure an additional configurable circuit block to implement the functions of the first mode using the additional configuration bits provided from the additional configuration status register circuit;
instructions executable to decode the subset of the mode bits received from the mode register circuit to generate additional decoded bits using an additional mode decoder circuit;
instructions executable to provide the additional decoded bits from the additional mode decoder circuit through a second multiplexer circuit to the additional configurable circuit block instead of the additional configuration bits in response to the at least one of the mode bits; and
instructions executable to reconfigure the additional configurable circuit block to implement the functions of the second mode using the additional decoded bits.

21. The computer readable non-transitory medium of claim 17, wherein the instructions executable to provide the decoded bits from the mode decoder circuit through the first multiplexer circuit to the configurable circuit block further comprises instructions executable to provide the decoded bits through the first multiplexer circuit to the configuration status register circuit.

* * * * *